US 6,746,911 B2

United States Patent
Han

(10) Patent No.: US 6,746,911 B2
(45) Date of Patent: Jun. 8, 2004

(54) SEMICONDUCTOR DEVICE WITH STACKED MEMORY AND LOGIC SUBSTRATES AND METHOD FOR FABRICATING THE SAME

(75) Inventor: Il-Suk Han, Ichon (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 47 days.

(21) Appl. No.: 10/443,365

(22) Filed: May 22, 2003

(65) Prior Publication Data

US 2003/0197268 A1 Oct. 23, 2003

Related U.S. Application Data

(62) Division of application No. 09/916,961, filed on Jul. 27, 2001, now Pat. No. 6,593,184.

(30) Foreign Application Priority Data

Jul. 31, 2000 (KR) ........................................ 2000-44301

(51) Int. Cl.[7] .................... H01L 21/8242; H01L 21/20; H01L 21/336
(52) U.S. Cl. ...................... 438/241; 438/253; 438/396; 438/928; 438/257; 438/258; 257/296; 257/303; 257/306; 257/316
(58) Field of Search .................. 438/928, 253–255, 438/396–399, 257–258, 161, 241, FOR 484, FOR 201, FOR 269; 257/296, 303, 306, 316, 318

(56) References Cited

U.S. PATENT DOCUMENTS

| | | | | |
|---|---|---|---|---|
| 5,877,034 A | | 3/1999 | Ramm et al. | |
| 5,959,322 A | * | 9/1999 | Lee | 257/298 |
| 5,976,953 A | * | 11/1999 | Zavracky et al. | 438/455 |
| 6,300,179 B1 | * | 10/2001 | McKee | 438/206 |
| 6,423,596 B1 | * | 7/2002 | McKee | 438/253 |
| 6,429,070 B1 | * | 8/2002 | Gonzalez et al. | 438/253 |
| 6,441,424 B1 | * | 8/2002 | Klose et al. | 257/308 |
| 6,458,638 B2 | * | 10/2002 | Kim | 438/157 |

FOREIGN PATENT DOCUMENTS

JP     2000343698 A * 12/2000 ............. B41J/2/05

* cited by examiner

Primary Examiner—John Niebling
Assistant Examiner—Jennifer M. Kennedy
(74) Attorney, Agent, or Firm—Marshall, Gerstein & Borun LLP

(57) ABSTRACT

Disclosed are a semiconductor device and a method for fabricating the same and, more particularly, a method for decreasing the size of semiconductor devices by stacking two substrates, one of which has only memory cells and the other of which has only logic circuits is disclosed. The disclosed method includes forming memory cells on a first semiconductor substrate; forming logic circuits on a second semiconductor substrate; and stacking the second semiconductor substrate on the first semiconductor substrate in order that the memory cells are electrically operable to the logic circuits on the second semiconductor substrate. In the disclosed stacked semiconductor substrate, the logic circuit area is placed on the memory cell area and these two areas are electrically connected by a metal interconnection, thereby decreasing the size of the semiconductor devices.

10 Claims, 5 Drawing Sheets

SEMICONDUCTOR DEVICE WITH STACKED MEMORY AND LOGIC SUBSTRATES AND METHOD FOR FABRICATING THE SAME

This is a divisional of U.S. application Ser. No. 09/916,961, filed Jul. 27, 2001 now U.S. Pat. No. 6,593,184.

FIELD OF THE INVENTION

The present invention relates to a semiconductor device and a method for fabricating the same. More particularly, the present invention relates to a semiconductor device and a method for decreasing the size of semiconductor devices by stacking two substrates, one of which has only memory cells and the other of which has only logic circuits.

DESCRIPTION OF THE RELATED ARTS

Generally, memory cells and logic circuits are formed in a semiconductor substrate. In the case of a flash memory cell having a programmable split gates, such as a floating gate (FG), a selective gate (SG) and a control gate (CG), gate electrodes of transistors in the logic circuits are made with the programmable conducting layer of the memory cell transistors.

FIGS. 1A to 1C are cross-sectional views illustrating a method for fabricating a conventional semiconductor device having memory cells and logic circuits. In FIGS. 1A to 1C, EEPROM (Electrically Erasable Programmable Read Only Memory) cells and logic circuits are formed on the same semiconductor substrate.

Referring to FIG. 1A, after forming a field oxide layer 12 to isolate a memory cell area (X) from a logic area (Y), a first polysilicon layer 13 and a second polysilicon layer 14 are formed on the semiconductor substrate 11 and the first and second polysilicon layers 13 and 14 are patterned so as to form a floating gate (FG) and a programmable gate of a flash memory device, respectively. Subsequently, a third polysilicon layer 15 is formed on the resulting structure and patterned in order to form a selective gate (SG). At this time, the third polysilicon layer 15 remains on the logic area (Y) without the patterning process. After forming the programmable gate, a source/drain region 16 is formed in the semiconductor substrate 11. For sake of convenience, gate oxide layers, which are formed between gate electrodes and between the floating gate and the semiconductor substrate 11, are not shown in the figures.

Referring to FIG. 1B, gate electrodes 15b of transistors in the logic circuits are formed by selectively etching the third polysilicon layer 15 and source/drain regions 16a are formed.

Next, referring to FIG. 1C, a first interlayer insulation layer 17 is formed on the resulting structure including the cell and logic areas and the planarization process is applied to the first interlayer insulation layer 17. Contact holes for a metal interconnection are formed by selectively etching the first interlayer insulation layer 17 and first metal wires 18, which are in contact with the source/drain regions 16 and 16a, are formed. After forming the first metal wires 18, a second interlayer insulation layer 19 is formed on the resulting structure, a second metal wire 20 is formed on the second interlayer insulation layer 19, and a passivation layer 21 is formed on the resulting structure.

However, in the conventional memory fabricating method described above, since the memory cell and logic circuit are formed on the same semiconductor substrate, a size of the entire device is increased with the increase of the size of the memory cell area so that it is difficult to develop different appliances, such as a video controller having a high memory capacity and a micro controller unit having flash EEPROMs. Further, since the devices are implemented based on the memory fabricating method, a various techniques to implement the logic circuits are limited to the related fabricating method. Accordingly, a high-speed logic control is not optimized in the case where the memory cell and logic circuit are formed on the same semiconductor substrate.

SUMMARY OF THE DISCLOSURE

A semiconductor device of decreases size is disclosed and which includes two stacked substrates, each of which has a memory cell area and logic circuit area. A method for fabricating the same is also disclosed.

A method for optimizing operations of memory cells and logic circuits formed on the same chip by using at least two stacked substrates, each of which has memory cells and logic circuits is also disclosed.

A semiconductor device is disclosed which comprises a first semiconductor substrate on which memory cell area is formed; and a second semiconductor substrate on which logic circuit area is formed, wherein the second semiconductor substrate is stacked on the first semiconductor substrate in order that the logic circuit area operates the memory cell area.

A method for forming a semiconductor device is disclosed which comprises the steps of: forming memory cells on a first semiconductor substrate; forming logic circuits on a second semiconductor substrate; and stacking the second semiconductor substrate on the first semiconductor substrate in order that the memory cells are electrically operable to the logic circuits on the second semiconductor substrate.

A method for forming a semiconductor device is also disclosed which comprises the steps of: a) forming memory cells on a first semiconductor substrate, wherein the memory cells include a first metal wire; b) forming logic circuits on a second semiconductor substrate, wherein the logic circuits include a second metal wire; c) stacking the second semiconductor substrate on the first semiconductor substrate by applying a thermal treatment to the first and second metal wires in order to connect the second semiconductor substrate to the first semiconductor substrate; d) polishing a rear side of the second semiconductor substrate; e) forming an insulation layer on the rear side of the second semiconductor substrate; f) patterning the insulation layer and forming a via hole to expose the second metal wire; g) forming a metal plug in the via hole; and h) forming a conducting layer electrically connected to the second metal wire through the metal plug.

BRIEF DESCRIPTION OF THE DRAWINGS

Other aspects of the disclosed devices and methods will become apparent from the following description of the embodiments with reference to the accompanying drawings, wherein.

DETAILED DESCRIPTION OF THE PRESENTLY EMBODIMENTS

Figure 1A:
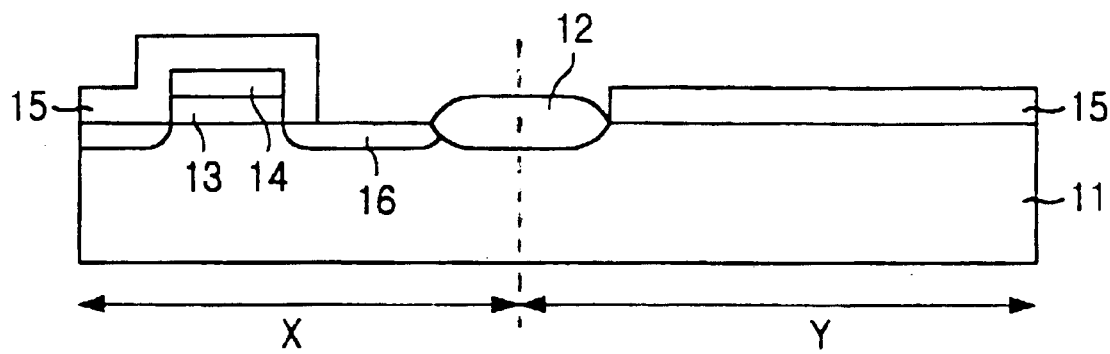
FIGS. 1A to 1C are cross-sectional views illustrating a method for fabricating a conventional semiconductor device having memory cells and logic circuits.
Figure 1B:
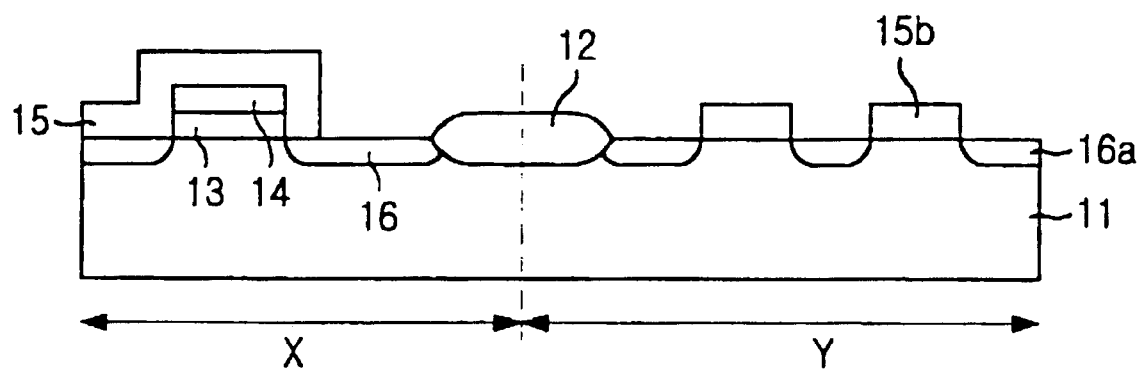
Figure 1C:
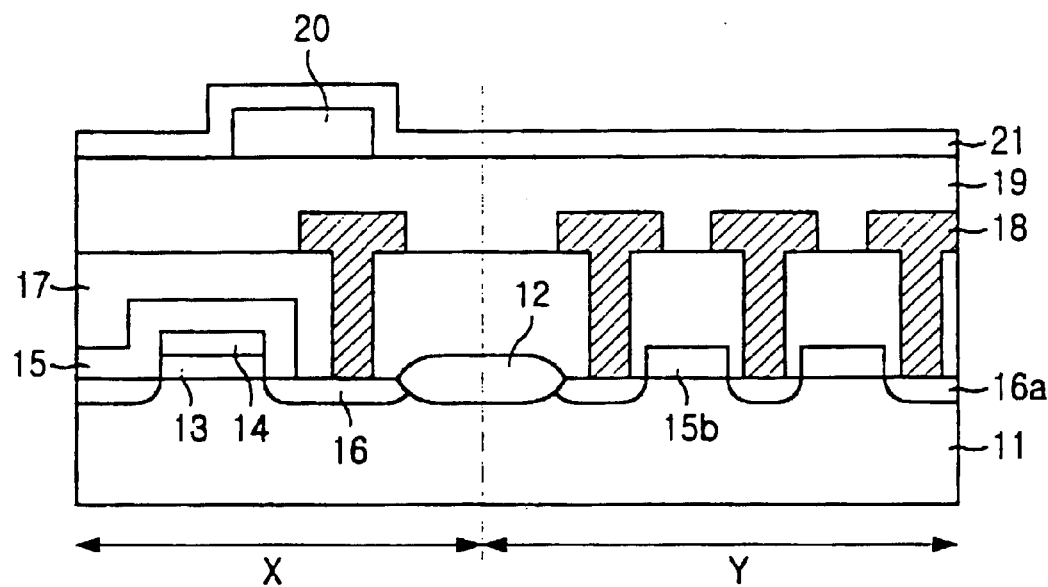
Figure 2A:
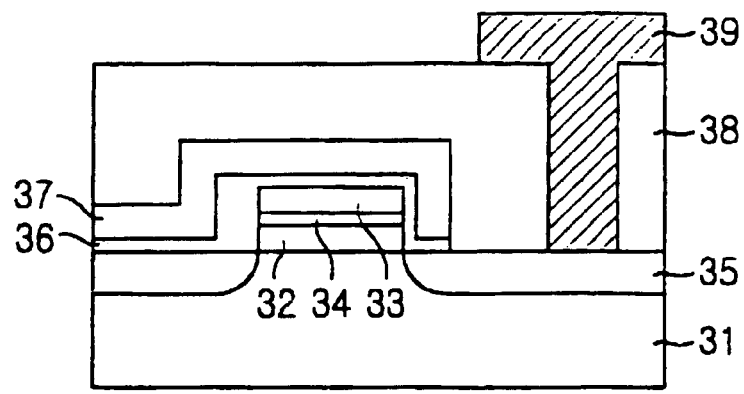
FIGS. 2A to 2E are cross-sectional views illustrating a method for fabricating semiconductor devices using individual substrate for memory cells or logic according to embodiments of the present invention.

First, referring to FIG. 2A, after depositing a first polysilicon layer 32 for a floating gate and a second polysilicon layer 33 for a programmable gate on a first semiconductor substrate 31 in this order, the second polysilicon layer 33 and the first polysilicon layer 32 are simultaneously patterned, thereby forming the programmable gate and the floating gate, respectively. At this time, a gate oxide layer 34 is formed between the programmable gate and the floating gate and another gate oxide layer (not shown) is formed beneath the floating gate. Subsequently, a first source/drain 35 is formed in the first semiconductor substrate 31 and a gate oxide layer 36 is formed on the resulting structure. A third polysilicon layer 37 for a selective gate is formed on the gate oxide layer 36.

The third polysilicon layer 37 for the selective gate is patterned so as to form a split gate structure and a first interlayer insulation layer 38 is formed on the resulting structure. A contact hole to expose the surface of the first source/drain 35 is formed by selectively etching the first interlayer insulation layer 38 and a first metal wire 39, which is in contact with the expose surface of the first source/drain 35, is formed within the contact hole.

Figure 2B:
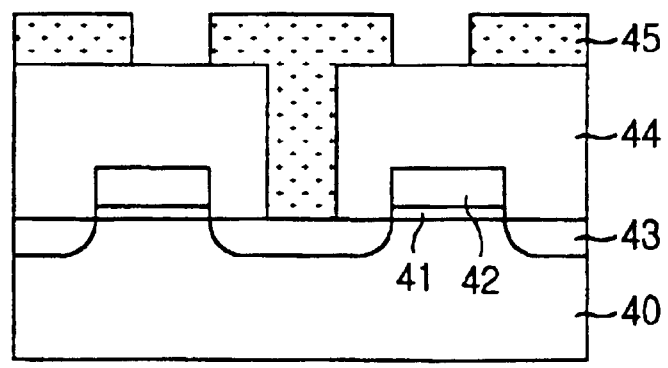

Referring to FIG. 2B, a gate oxide layer 41 for the logic circuits is formed on a second semiconductor substrate 40 and a fourth polysilicon layer 42 is formed on the gate oxide layer 41. A plurality of gate electrodes are formed by selectively patterning the fourth polysilicon layer 42. At this time, the plurality of gate electrodes, which are formed over the second semiconductor substrate 40, may be formed while the selective gate is formed by the third polysilicon layer 37 in the first semiconductor substrate 31. After forming the plurality of gate electrodes, a second source/drain 43 is formed in the second semiconductor substrate 40. Subsequently, a second interlayer insulation layer 44 is formed on the resulting structure, a contact hole to expose the surface of the second source/drain 43 is formed by selectively etching the a second interlayer insulation layer 44, and then a second metal wire 45 which is in contact with the second source/drain 43 is formed.

Figure 2C:
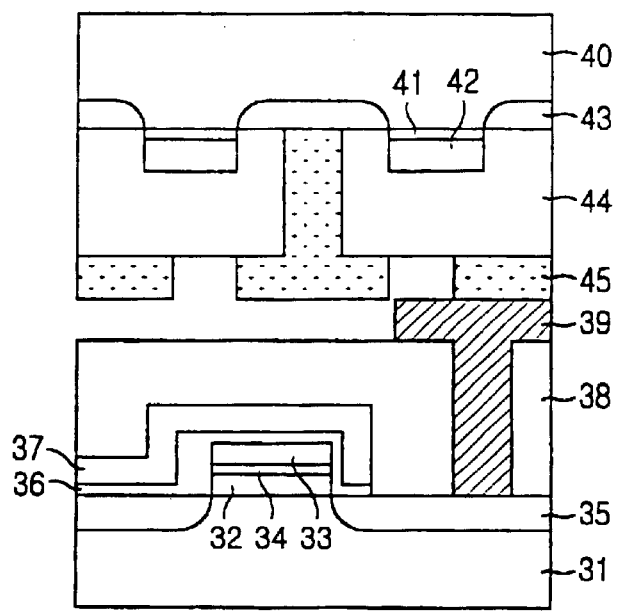

Referring to FIG. 2C, the second semiconductor substrate 40 is stacked on the first semiconductor substrate 31 so that the second metal wire 45 in the second semiconductor substrate 40 is in contact with the first metal wire 39 in the first semiconductor substrate 31. The arrangement of two substrates may be carried out by forming alignment marks on a specific area of the first and second semiconductor substrates 31 and 40. Subsequently, a thermal treatment is applied to the first and second semiconductor substrates 31 and 40 at a temperature of approximately 350° C. to 450° C. and then these two metal wires are electrically connected to each other. Accordingly, the first metal wire 39 in the first semiconductor substrate 31 and the second metal wire 45 in the second semiconductor substrate 40 is used as a metal wire in the combined semiconductor substrate.

Figure 2D:
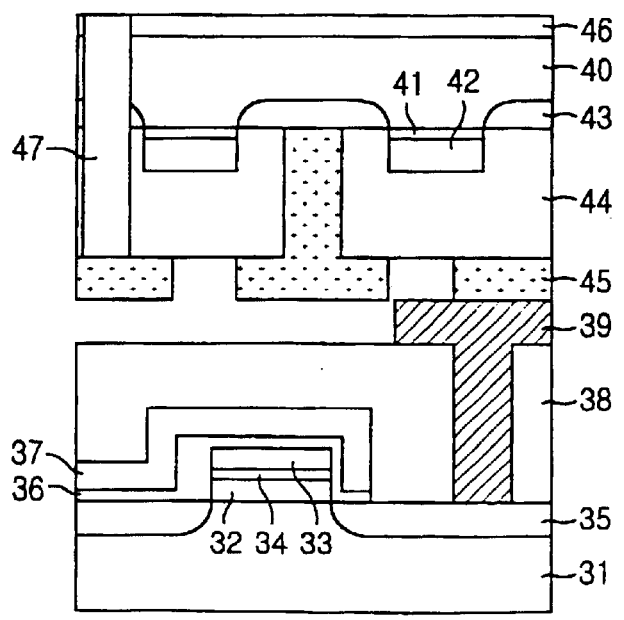

Referring to FIG. 2D, the rear side of the second semiconductor substrate 40 is polished by a grinder until the remaining substrate has a thickness of approximately 1.5 $\mu$m to 2 $\mu$m. After the first polishing, the second semiconductor substrate 40 is polished again in a chemical mechanical polishing equipment until the remaining substrate has a thickness of approximately 1 $\mu$m to 1.5 $\mu$m. Subsequently, an oxide layer 46 is deposited on the rear side of the second semiconductor substrate 40 to a thickness ranging from about 3000 Å to about 6000 Å and a via hole 47 to expose the second metal wire 45 is formed with a contact size of 1 $\mu$m to 1.5 $\mu$m, by using the dry-etching method.

Figure 2E:
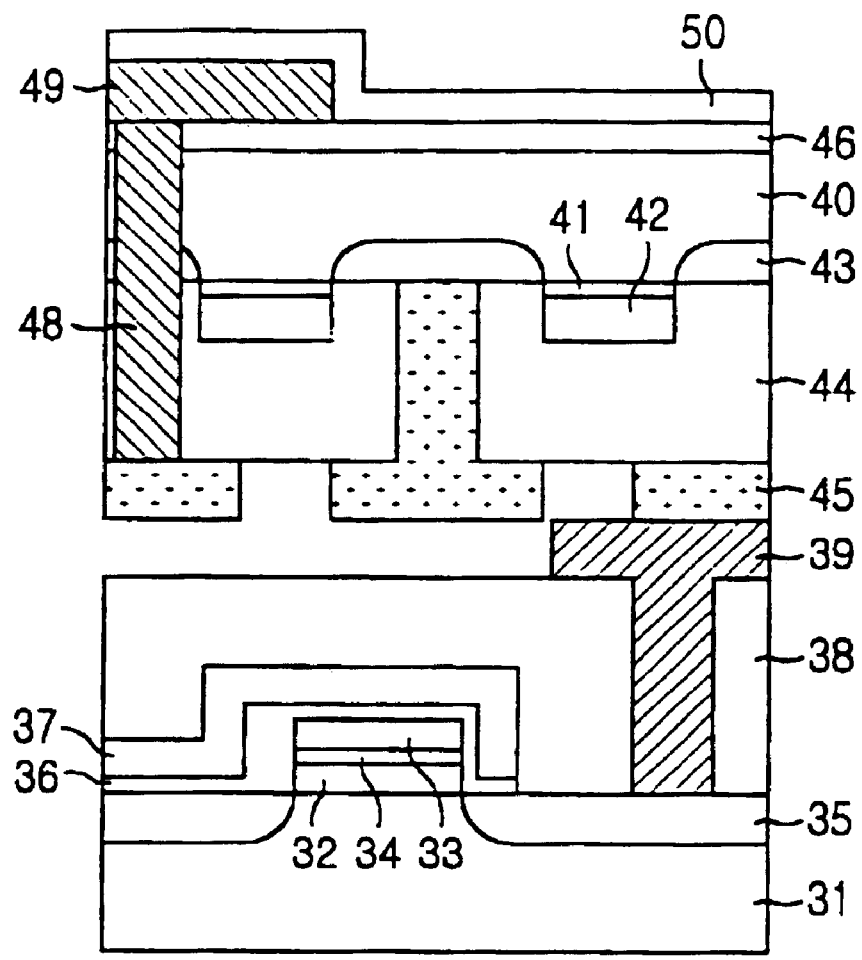

Referring to FIG. 2E, a tungsten layer is formed on the resulting structure to a thickness ranging from about 8000 Å to about 1000 Å and a blanket etching process is applied to the tungsten layer in order to form a tungsten plug 48 which is electrically connected to the second metal wire 45. An aluminum layer 49, as a third metal wire, is formed on the resulting structure to a thickness ranging from about 6000 Å to about 10,000 Å so that the aluminum layer 49 is electrically connected to the second metal wire 45 through the tungsten plug 48. The aluminum layer 49 is patterned and a passivation layer 50 is formed on the resulting structure. As a result, in the stacked semiconductor substrate according to the present invention, the logic circuit area is placed on the memory cell area and these two areas are electrically connected by a metal interconnection, thereby decreasing the size of the semiconductor devices.

As apparent from the above, the disclosed method and devices decrease the size of memory/logic device by stacking two semiconductor substrates, each of which is adapted itself to a different semiconductor fabricating method. Furthermore, the characteristics of the transistors formed on each semiconductor substrate are improved because each transistor is formed by appropriate fabricating methods, complying with the requirements of the memory cells and the logic circuits.

Although the preferred embodiments of the present invention have been disclosed for illustrative purpose, those skilled in the art will appreciate that various modifications, additions and substitutes are possible, without departing from the scope and spirit of the present invention as described in the accompanying claims.

What is claimed is:

1. A method for forming a semiconductor device comprising:
   forming memory cells on a first semiconductor substrate;
   forming logic circuits on a second semiconductor substrate; and
   stacking the second semiconductor substrate on the first semiconductor substrate in order that the memory cells are electrically operable to the logic circuits on the second semiconductor substrate wherein the stacking of the second semiconductor substrate on the first semiconductor substrate comprises the step of stacking, directly on a first metal wire in the first semiconductor substrate, a second metal wire in the second semiconductor substrate and applying a thermal treatment to the first and second metal wires.

2. The method of claim 1, further comprising:
   polishing a rear side of the second semiconductor substrate;
   forming a contact mask on the rear side of the second semiconductor substrate and exposing the second metal wire formed on the second semiconductor substrate; and
   forming a conducting layer which is electrically connected to the second metal wire formed on the second semiconductor substrate.

3. The method of claim 2, wherein the polishing of the rear side of the second semiconductor substrate comprises:
   polishing the rear side of the second semiconductor substrate by a mechanical polishing method; and
   polishing the rear side of the second semiconductor substrate by a chemical mechanical polishing method.

4. A method for forming a semiconductor device comprising:
   a) forming memory cells on a first semiconductor substrate, wherein the memory cells include a first metal wire;

b) forming logic circuits on a second semiconductor substrate, wherein the logic circuits include a second metal wire;

c) stacking the second semiconductor substrate on the first semiconductor substrate by applying a thermal treatment to the first and second metal wires in order to connect the second semiconductor substrate to the first semiconductor substrate;

d) polishing a rear side of the second semiconductor substrate;

e) forming an insulation layer on the rear side of the second semiconductor substrate;

f) patterning the insulation layer and forming a via hole to expose the second metal wire;

g) forming a metal plug in the via hole; and h) forming a conducting layer electrically connected to the second metal wire through the metal plug.

5. The method of claim 4, wherein the step c) is carried out at a temperature ranging from about 350° C. to about 450° C.

6. The method of claim 4, wherein the step d) comprises:

polishing the rear side of the second semiconductor substrate by a mechanical polishing method; and polishing the rear side of the second semiconductor substrate by a chemical mechanical polishing method.

7. The method of claim 4, wherein the insulation layer is formed at a thickness ranging from about 3000 Å to about 6000 Å.

8. The method of claim 4, wherein the via hole has a contact size ranging from about 1 µm to about 1.5 µm.

9. The method of claim 4, wherein the metal plug is formed at a thickness ranging from about 8000 Å to about 10,000 Å.

10. The method of claim 4, wherein the conducting layer is formed at a thickness ranging from about 6000 Å to about 10,000 Å.

* * * * *

UNITED STATES PATENT AND TRADEMARK OFFICE
CERTIFICATE OF CORRECTION

PATENT NO. : 6,746,911 B2 Page 1 of 1
DATED : June 8, 2004
INVENTOR(S) : Il-Suk Han It is certified that error appears in the above-identified patent and that said Letters Patent is hereby corrected as shown below:

Title page,
Item [75], Inventor, please delete "Il-Suk Han, Ichon (KR)" and replace with -- IL-Suk Han, Kyougki-do (KR) --.

Signed and Sealed this

First Day of February, 2005

JON W. DUDAS
*Director of the United States Patent and Trademark Office*